United States Patent [19]

Christensen

[11] Patent Number: 4,857,009

[45] Date of Patent: Aug. 15, 1989

[54] FIXTURE LATCHING MECHANISM

[75] Inventor: Michael L. Christensen, Loveland, Colo.

[73] Assignee: Hewlett-Packard Company, Palo Alto, Calif.

[21] Appl. No.: 222,437

[22] Filed: Jul. 21, 1988

[51] Int. Cl.[4] .............................................. G01R 15/12
[52] U.S. Cl. ...................................... 439/372; 269/32; 324/158 F
[58] Field of Search ............... 439/296, 330, 331, 345, 439/372, 310, 347, 350, 352; 324/158 F, 158 P, 73 PC; 269/227, 24, 27, 32, 33, 232–234, 229, 903; 248/680, 681

[56]  References Cited

U.S. PATENT DOCUMENTS

| 3,948,502 | 4/1976 | Waller | 269/32 |
|---|---|---|---|
| 3,970,934 | 7/1976 | Aksu | 324/158 F |
| 4,230,985 | 10/1980 | Matrone et al. | 324/158 F |
| 4,540,227 | 9/1985 | Faraci | 439/260 |
| 4,618,131 | 10/1986 | Campisi et al. | 269/32 |
| 4,620,761 | 11/1986 | Smith et al. | 439/372 |

Primary Examiner—Neil Abrams
Attorney, Agent, or Firm—Jeffery B. Fromm

[57] ABSTRACT

A fixture latching mechanism for mass terminating a printed circuit test fixture to a test head probe field wherein said fixture latching mechanism is comprised of simultaneously functioning pulldown towers, each of which further comprises a housing having an internal wall for guiding a vertically moving rack containing a horizontally and forwardly biased pulldown which engages the fixture as the rack is powered downward and which disengages from the fixture as the rack is powered upward. Preferably, the disengagement of the pulldown from the fixture is produced by a caming action on a cam follower attached to the rear portion of the pulldown as the cam follower engages a cam system positioned in the upper regions of the housing's internal wall.

17 Claims, 9 Drawing Sheets

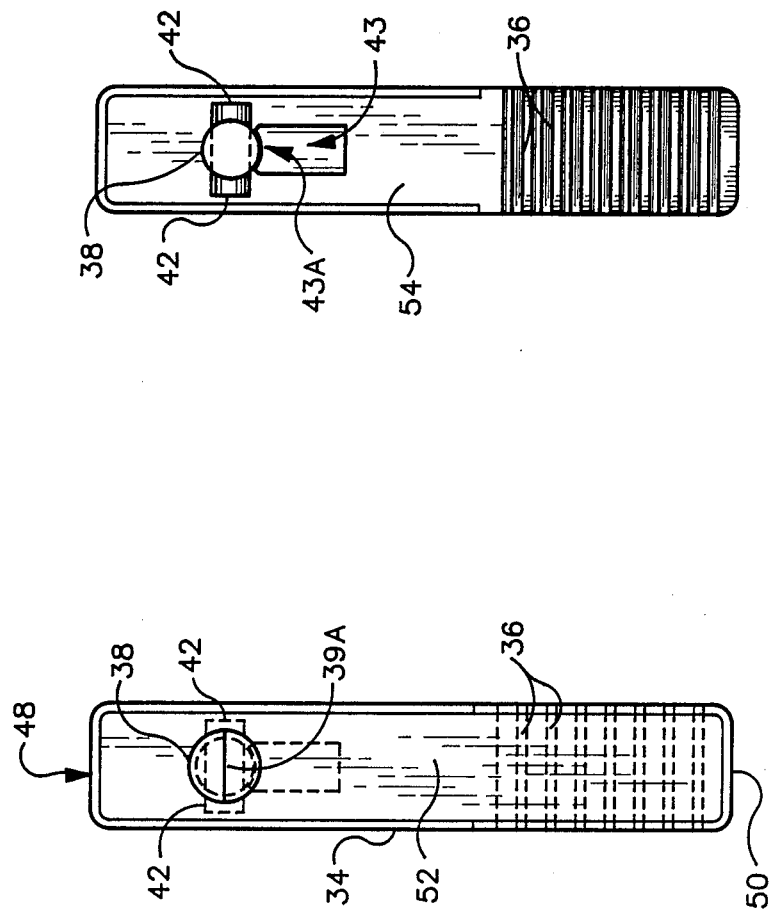

FIXTURE LATCHING MECHANISM

BACKGROUND OF THE INVENTION

1. Field of the Invention

This invention relates to fixtures of the type generally used in testing printed circuit boards. More specifically it relates to devices for mechanically engaging and disengaging such fixtures to and from spring loaded test probes which make up a probe field of such test devices.

2. Description or the Prior Art

Fixture latching mechanisms provide means for mass terminating a circuit board test fixture to a testhead. A mass electrical interconnect is achieved when the wire wrap posts in the fixture are made to contact and compress an array of spring loaded probes which form the probe field portion of the testhead.

Those skilled in this art will appreciate that even though the force produced by each individual probe is usually small (e.g., 2.5 oz. at about a working travel of about 0.07 inches) the large number of probes (e.g., hundreds and even thousands per testhead) can collectively create a large overall force which must be overcome in order to achieve and maintain proper electrical contact between all respective members of an array of wrap posts and probes. Fixture latch mechanisms are designed to provide the total force needed to compress the spring loaded probes in a precise and uniform manner.

Vacuum, electrical and mechanical methods have been used to provide the forces needed to properly contact such fixtures to their intended probe field. However, each of these methods has presented various problems. Vacuum operated systems have presented problems which generally revolve around sealing the vacuum chamber under all possible conditions of operation. For example, since such probes are usually also mounted on cards, each of the many individual cards employed has to be sealed at the top of the testhead. Moreover, it is entirely possible that not all of the cards will be employed. Thus, filler panels are required to seal the chamber where the cards are absent.

Another problem arises when the interface is required to accommodate both large and small fixtures. In such a case two vacuum chambers are required with valving between them. All such sealing problems ultimately add cost and complexity; they also generally contribute to reduced reliability. Some vacuum sealing problems can be eliminated by removing the probes from the board and putting them directly in the testhead. However, this arrangement creates an added interface which tends to degrade electrical performance. It also increases cost by forcing the user to buy the maximum number of probes when he may only need a small fraction of the total to meet his particular testing needs. This added cost is significant because even though individual probe cost is relatively small the quantity is large (several thousand per testhead is not at all unusual) and therefore so is the total cost.

Various mechanical linkage systems also have been employed in such fixture latching mechanisms with varying degrees of success. One such system utilizes a bullet nosed cylindrical contact which resides in the fixture and which mates with a socket in the testhead to complete the electrical connection. The fixture is brought into contact with the testhead by a hand crank actuated cam mechanism. The main problems associated with this system is damage to the bullet nosed contact as the fixture is inserted and removed from the test device. Costs and the use of manually actuated engaging operations also present problems. This follows from the fact that while the cost of the socket in the testhead is relatively modest per contact, the cost of the bullet nose contact is rather high per contact. Since the average user must buy many fixtures, it is not unusual for the fixture cost to exceed the system cost. Moreover, the crank actuated cam mechanism used in many designs currently in use is not only costly it also has the disadvantage of requiring the operator to manually turn a crank to actuate the mechanism. Many operators of small physical stature have had difficulty supplying the required force to actuate such hand operated mechanisms over a work day.

Another manually operated fixture testing system is disclosed in U.S. Pat. No. 4,230,985. It has a fixture latching mechanism wherein a series of mating slots are provided in a configuration matching a row of mating guides on the fixture. The mating guides are inserted into mating slots. When a handle is manually turned, a track is drawn horizontally to force the mating guides, and their associated fixture, downward and into contact with an array of spring loaded probes. Because this system uses such a large number of mating guides and slots which must be simultaneously aligned, lowered and engaged by a horizontally moving rail, it takes a great deal of time to change fixtures and/or carry out circuit board testing operations. Moreover, since the mating guides project from the fixture they are apt to be bent or broken during the frequent fixture changing operations implicit in the use of such test devices.

Yet another mechanical system for providing a mass electrical interconnect involves the use of zero insertion force connectors or "ZIFs". In this design a latching mechanism is not required because no force is required to insert the connectors although there is some force required to actuate the ZIF. The main disadvantage of the ZIFs is that they usually require long wire lengths which degrade electrical performance to such an extent that such systems have not, to date, proven to be reliable enough to gain widespread acceptance.

The problems associated with the above noted electrical air and mechanical systems suggest the need for a simpler, more reliable, faster operating fixture latching mechanism whose engaging guides are withdrawn to safe unexposed positions during fixture changing operations.

SUMMARY OF THE INVENTION

The latching mechanism of this patent disclosure is comprised of four major cooperating parts: a housing, a rack, a pulldown, and a lever arm. The latching mechanism can be mechanically, pneumatically or electrically driven. Most preferably the mechanism is pneumatically driven and will generally operate as follows. A mechanical force is applied to the lever gear means causing it to rotate. The lever gear means engages a mating gear means of the rack causing said rack to move. As the rack moves in one direction (preferably downward) the pulldown piece is driven forward due to a force imparted to the pulldown by a biasing means such as a spring. The forwardly driven pulldown engages the fixture, preferably by engagement means located in the sides of the fixture. The latching mechanism then drives the fixture onto contact with at least one probe in order to overcome the probe's spring force and complete an electrical connection between the probe and the fixture. Again, those skilled in this art will appreciate that probes of this kind are usually used in large arrays of hundreds or even thousands of individual probes which are commonly known collectively as "probe fields". The fixture is released from the probe when the air cylinder drives the lever gear in the opposite direction (preferably upward). As the rack is forced upward, the pulldown is retracted into the housing as the pulldown is forced to follow a caming surface located within the housing. So retracted the pulldown is out of harm's way. The fixture can then be lifted off the probe field, preferably by the action of a spring loaded probe protection plate which often makes up a part of such mechanisms, as well as by the spring forces produced by the probes themselves.

Those skilled in this art also will appreciate that this basic latching mechanism also can be, and most preferably is, employed in latching mechanism systems having more than one latching mechanism. Systems having 2, 3, or 4 latching mechanisms are of course highly preferred. Moreover, the latching mechanism of this patent disclosure is also capable of mass terminating a half sized or other small fixture in which case the use of two opposing mechanisms of a four element system is a particularly preferred arrangement.

In some of its more preferred embodiments this fixture latching mechanism can be presented in forms whose basic elements need more detailed descriptions than those given above. For example, a the basic latching mechanism for bringing a fixture into and out of contact with at least one electrical test probe might comprise: (1) a housing having an internal guidewall for guiding a pulldown rack wherein said guidewall further comprises a caming surface; (2) a pulldown rack having gear means for receiving a mating gear means of a lever gear arm and receiver means for receiving a pulldown which is slidably mounted in said receiver means; (3) a lever gear arm having a mating gear means which engages the gear means of the rack and which is pivotally mounted in the housing; and (4) a pulldown having a nosepiece and a caming surface and which is: (a) slidably mounted in the rack's receiver, (b) biased to a forward position in order to engage the nosepiece with a fixture as the pulldown rack moves in one direction and (c) pulled to a rearward position under a caming action imparted by the caming surface on the housing's internal guidewall to a cam follower attached to the pulldown as the rack moves in an opposite direction and thereby disengaging the nosepiece from the fixture.

This basic latching mechanism might further comprise a rack provided with a pulldown support means upon which the pulldown slidably moves. The latching mechanism might also have a pulldown which is slidably mounted for horizontal motion through a receiver located in an upper region of the rack, a rack which moves substantially vertically in response to a gearing action provided by the mating gear means of the lever arm which is capable of producing the full rearward movement of the pulldown achieved as the rack substantially reaches a full upward position.

Further preferred refinements in the latching mechanism might include a pulldown which has a rear portion having a cylinder configuration and a nosepiece having a half cylinder configuration whose flat surface is on the underside of the nosepiece in order to engage the fixture as the pulldown is forced in a downward direction by the rack as it is forced downward by the lever gear arm.

Those skilled in this art will appreciate that the terms "upward", "downward" etc., should not be given a literal or precise interpretation since such fixture latching mechanisms could be mounted at any angle to the floor upon which they rest. The pulldown can be biased to a full forward position by a biasing means such as a spring mounted in the rack's receiver means. Preferably, the full forward position is defined by an abutting action of the cam means on the rear side of the rack when the pulldown is biased in the forward direction by a spring. Preferably the cam means is a cylinder mounted in, and normal to, a rear portion of a cylindrical pulldown such that the guidewall and its caming surface are interjected between the rack and the forwardly biased caming cylinder as the rack is guided up and down in the housing. Again the cam also performs a stop function at the forward position of the pulldown.

More refined versions of a latching mechanism "system" for bringing a circuit board test fixture into and out of contact with a probe field would of course include more than one latching mechanism in a system of latching mechanisms (also referred to as "pulldown towers") which engage and disengage the fixture more or less simultaneously and uniformly. Thus, for example, such a system might include at least two but preferably no more than four pulldown towers, each of which individually comprises: (1) a housing having (a) a first slot in its front face through which the pulldown protrudes while in its full forward position and (b) a rectangular guidewall system whose rear wall has a rear wall slot for guiding a pulldown rack in response to a gear action imparted to said pulldown rack, and wherein said guidewall further comprises at least one caming surface; (2) a rectangular pulldown rack having gear means for receiving a mating gear means of a lever gear arm and receiver means for receiving a pulldown which is slidably mounted in said receiver; (3) a lever gear arm having a mating gear means which engages the gear means of the rack and which is pivotally mounted to the housing; and (4) a pulldown having a nosepiece and a caming surface and which is: (a) slidably mounted in the receiver, (b) biased to a forward position in order to engage the nosepiece with a fixture as the pulldown rack moves in one direction and (c) pulled to a rearward position under a caming action imparted to the pulldown by the caming surface on the housing guidewall as the rack moves in an opposite direction in order to disengage the nosepiece from the fixture.

Here again, each latching mechanism of the system preferably also will have a rack further comprising a pulldown support means and a pulldown which is slidably mounted for horizontal motion through a hollow cylindrical receiver located in an upper region of the rack, a rack which moves substantially vertically in response to a gearing action provided by the mating gear means of the lever gear arm and a full rearward movement of the pulldown defined by the rack reaching a full upward position.

Other preferred embodiments in such a system of latching mechanisms would include pulldowns having a rear portion having a cylindrical configuration and a nosepiece having a half cylinder nosepiece whose lower flat portion engages the fixture. Here again, the pulldown is preferably biased to a full forward position by a spring mounted in the rack's receiver means wherein the pulldown's full forward position is defined by an abutting action of the cam means on the rear surface of the rack. In such a system each pulldown will have a caming means which is a forwardly biased caming cylinder mounted in, and normal to, a rear portion of a cylindrical pulldown such that the guidewall and its caming surface are interjected between the rack and the forwardly biased caming cylinder as the rack is guided up and down in the housing. Obviously with arrangement, it is the movement of the racks, and not the pulldowns, which must be mechanically coordinated. This can be accomplished in known ways.

Various well known materials can be used in the construction of the latching mechanisms disclosed herein. Both the pulldown rack and the lever gear are preferably made of a steel alloy, most preferably by using powder metal technologies known to the art in producing low cost, high strength, high precision steel parts. The pulldown support is most preferably made of molded nylon with glass fiber and teflon fillers; the glass fiber adds strength while the teflon provides lubrication for the sliding surfaces. The pulldown pin and pulldown spring are most preferably made of stainless steel.

DESCRIPTION OF THE DRAWINGS

FIG. 13 is a front view of the rack.

FIG. 14 is a rear view of the rack.

DESCRIPTION OF THE PREFERRED EMBODIMENTS

Figure 1:
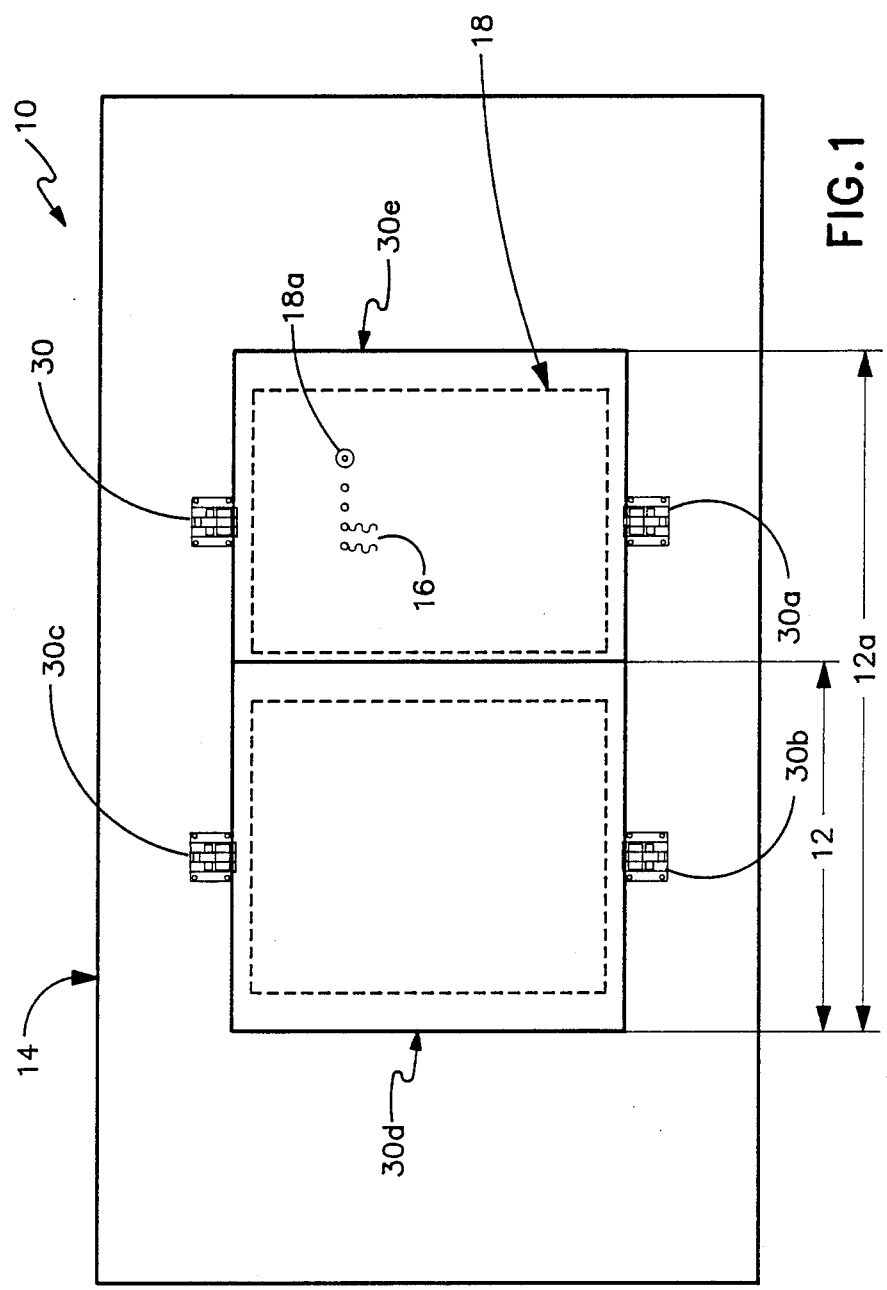
FIG. 1 is a top plan view of a fixture testing device showing the pulldown towers in representative positions.

FIG. 1 is a top plan view of a fixture testing device 10 for holding fixtures 12 and 12A on a testhead 14. FIG. 1 indicates that fixtures of various sizes 12 and 12A (which is, for example, shown as being twice the size of fixture 12) can be arrayed upon the fixture testing device 10. This is done to position one or more wrap posts 16 located in the fixture directly and respectively over one or more probes 18A (usually of the spring loaded type) which is a part of the test device. Those skilled in this art will appreciate that the probes are usually arrayed into a probe field 18 which is often comprised of hundreds and even thousands of individual probes 18A which contact their respective wire wrap post 16 in the fixture 12, 12A etc. Four fixture latching mechanisms (also sometimes herein referred to as "pulldown towers") 30, 30A, 30B and 30C are shown in place. Such fixture latching mechanisms could just as well be located on the ends of the fixtures, e.g., at points 30D and 30E as indicated in FIG. 1. Any number of such fixture latching mechanisms might be employed. By way of example, fixture 12 could be held by fixture latching mechanism 30B only; or it could be held by mechanisms 30B and 30C; or mechanisms 30B, 30C and another mechanism located at point 30D.

Figure 2:
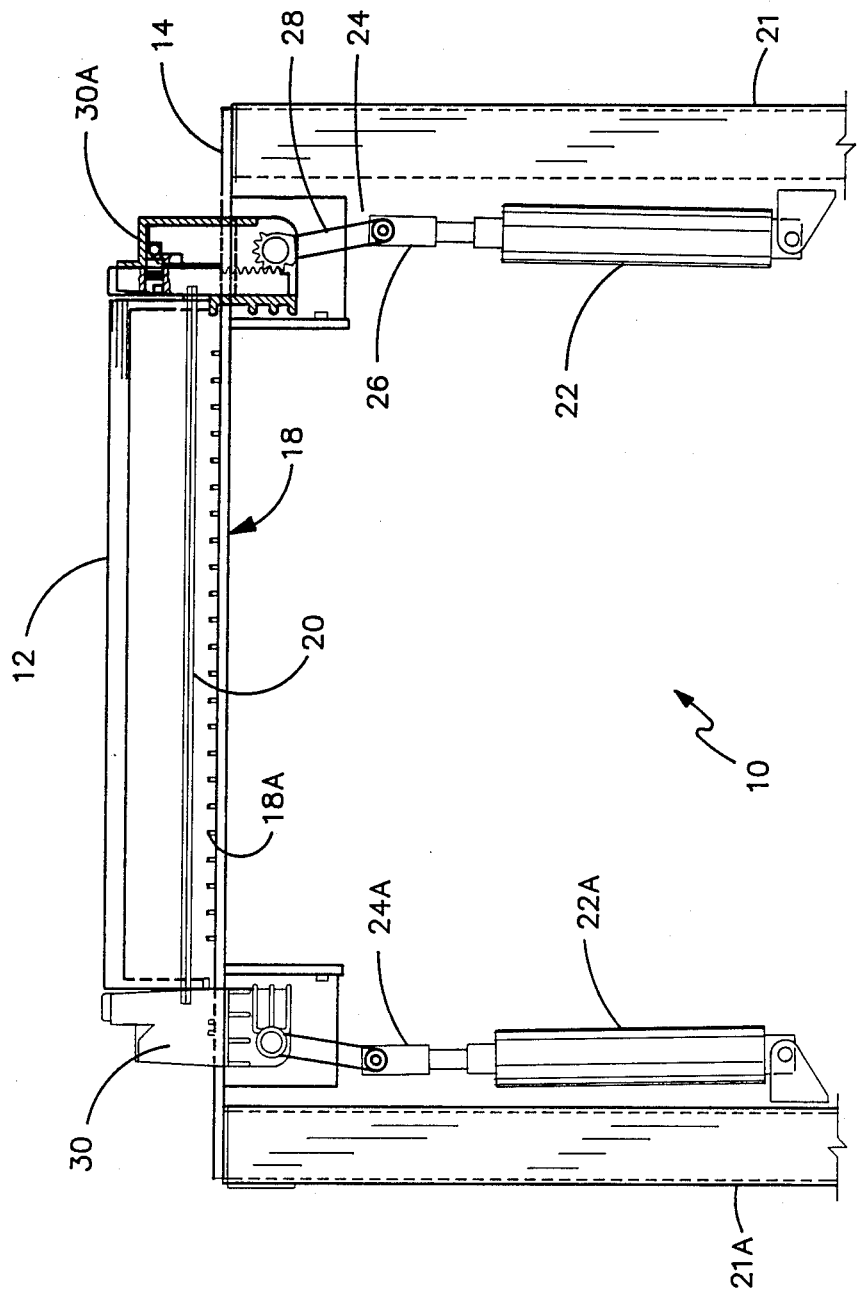
FIG. 2 is a side view of a fixture test device with its pulldown towers in their "up" position.

FIG. 2 is a side view of a fixture test device 10 with its latching mechanisms 30, 30A in their "up" position. A probe protection plate 20 is shown positioned between the fixture 12 and the individual probes 18A which make up probe field 18. Force producing means 22, 22A are shown attached to the sides 21 and 21A respectively of the fixture testing device 10. Again, the force producing means can be driven by air, mechanical and/or electrical forces. Furthermore, the latching mechanisms 30, 30A etc., can all be driven by a single force producing means; or each latching mechanism e.g., 30A can be driven by its own force producing means 22, 22A as shown in FIG. 2. Obviously when multiple force producing means 22, 22A etc., are employed, their actions should be made in unison and in a uniform manner. This can be accomplished in ways known to the electrical and mechanical arts. As is also shown in FIG. 2, a preferred embodiment of this invention, the pulldown towers are driven by individual air driven force producing means 22 and 22A etc., via a linkage system 24 pivotally connecting a rod 26 to the lever gear arm 28 which forms the first part of the herein disclosed fixture latching mechanism 30A.

Figure 3:
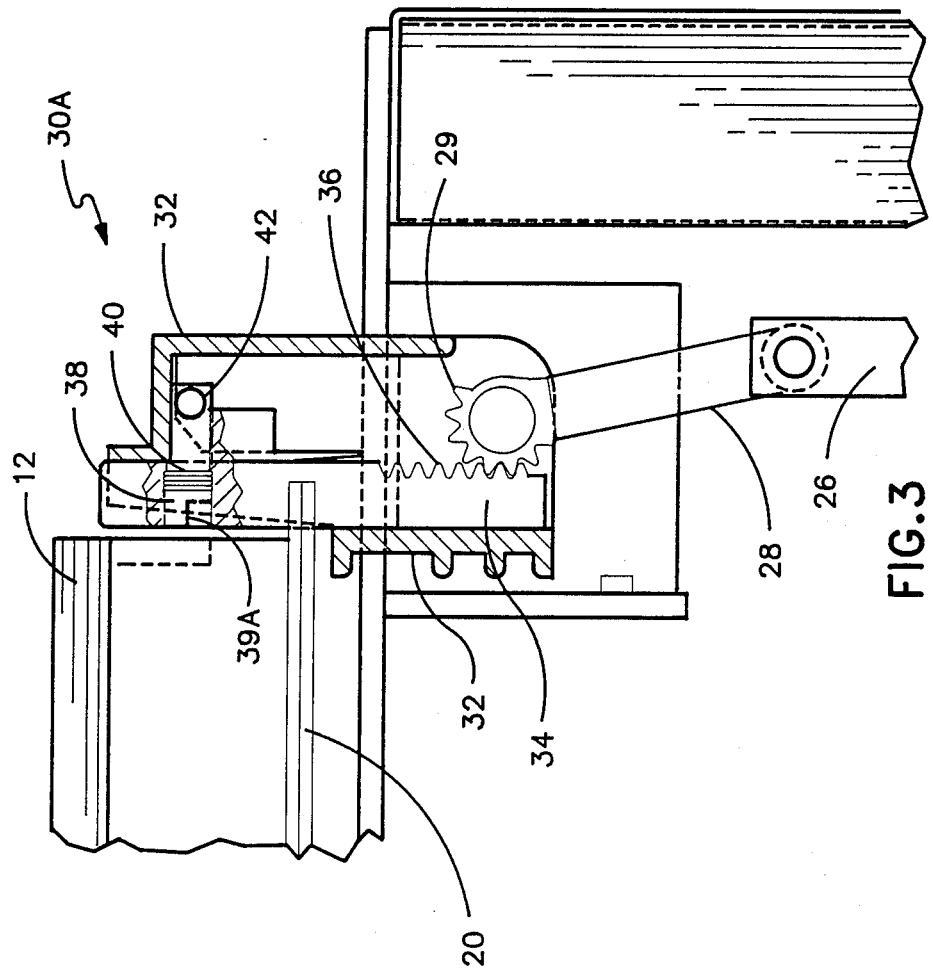
FIG. 3 is a detailed, partially cut away, side view of a pulldown tower in its up position.

FIG. 3 is a detailed, partially cut away, side view of fixture latching mechanism 30A, shown as in FIG. 2, in its "up" position. In this "up" position, the fixture 12 and the fixture latching mechanism 30A are not engaged. One of the more prominent elements of the fixture latching mechanism 30A shown in FIG. 3 is its housing 32 which houses a rack 34 which moves up and down in the housing 32. Once again, those skilled in this art will appreciate that the terms "up" and "down" are not absolute terms since fixtures of this type are often mounted at oblique angles to the floor (see, for example, FIG. 4, of U.S. Pat. No. 4,230,985) for various reasons including those of operator convenience and comfort.

FIG. 3 also shows that lever gear arm 28 terminates in a gear means 29 which cooperates with a mating gear means 36 on rack 34. A pulldown 38 is shown mounted in an upper region of the rack 34. The pulldown (also referred to as a pulldown pin) 38 is shown in a full rearward position produced by a caming action, on a cam means attached to the pulldown 38. It is when the fixture latching mechanism 30A is in this "up" position, and the pulldown piece 38 is consequently in its full rearward position, that the fixture 12 can be loaded into and unloaded out of the fixture latching mechanism 30A. In FIG. 3 the fixture 12 is shown resting upon probe protection plate 20.

Figure 4:
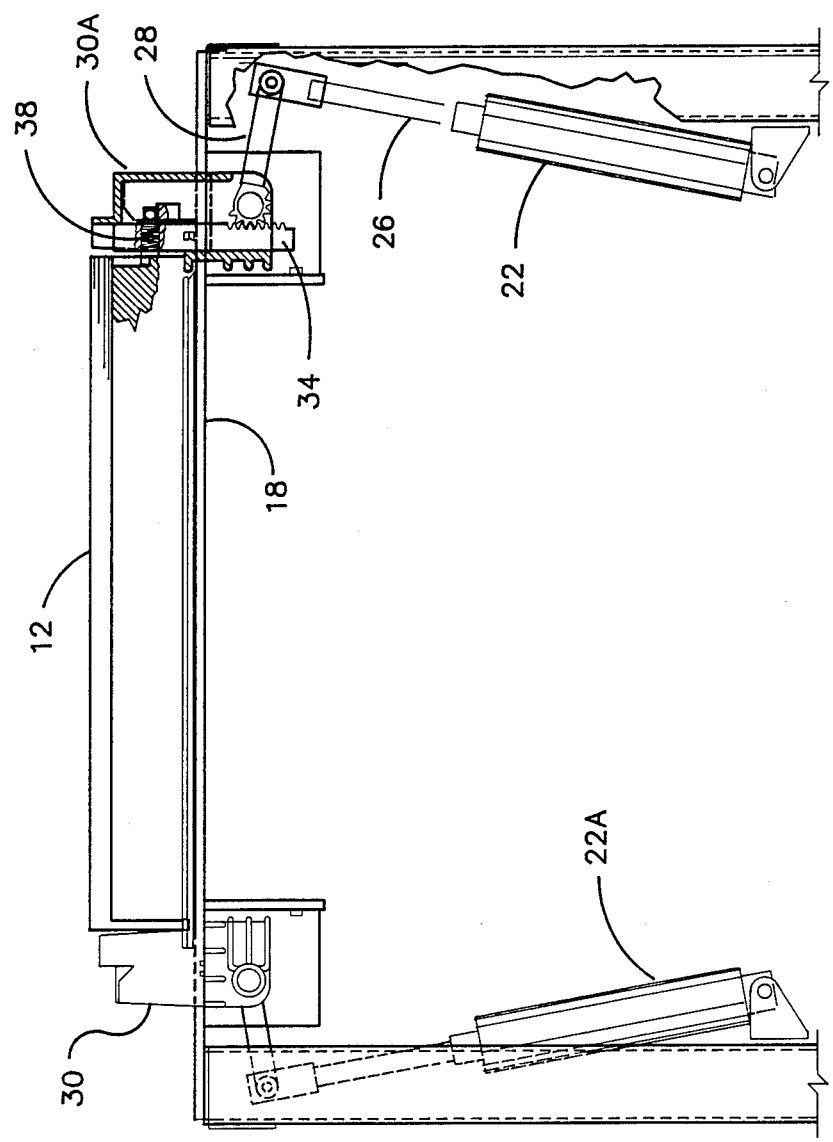
FIG. 4 is a side view of a fixture test device with its pulldown towers in their "down" position.

FIG. 4 shows the fixture latching mechanism 30A in its full "down" position. In this position the rack 34 in its full "down" position and pulldown 38 engages with the fixture 12 and pulls fixture 12 into contact with probe field 18. As implied by FIG. 4, the bottom of housing 32 is generally open to accommodate movements of the rack 34 and lever gear arm 28 through the bottom of housing 32.

Figure 5:
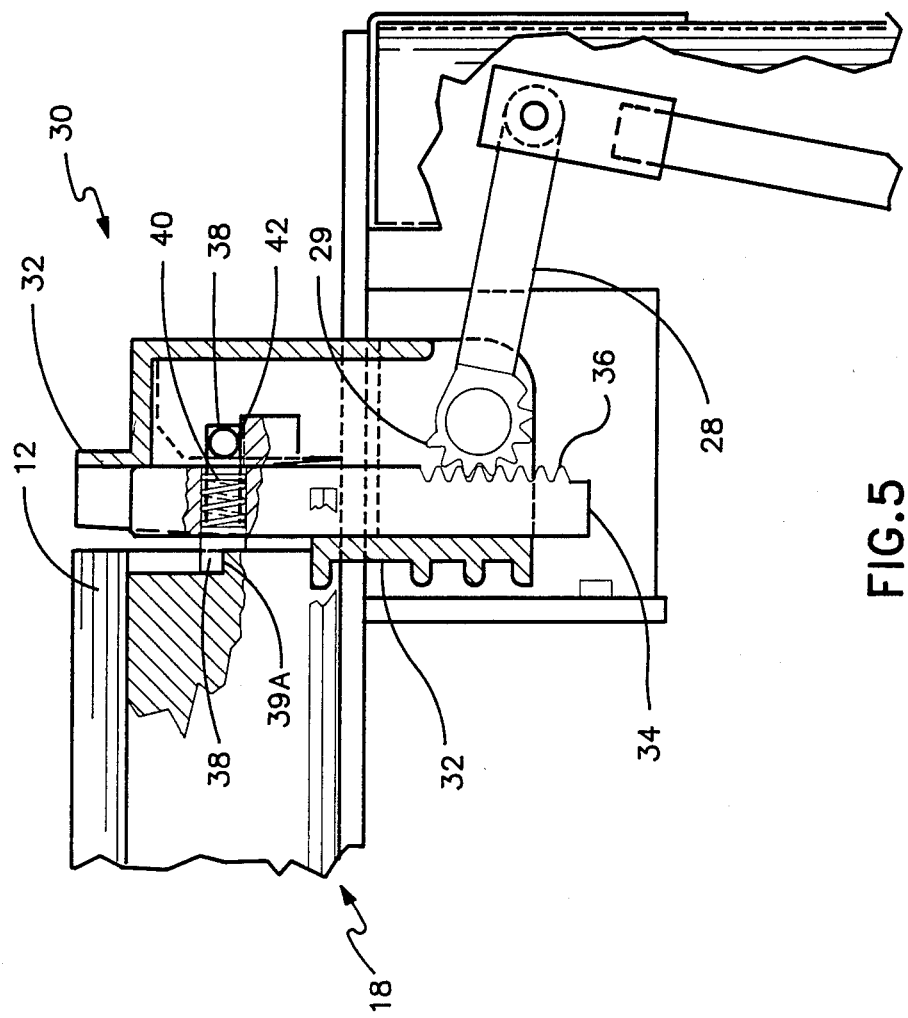
FIG. 5 is a detailed, partially cut away, side view of a pulldown tower in its down position.

FIG. 5 is a detailed, partially cut away, side view of the fixture latching mechanism 30A shown in FIG. 4. Again in this "down" position, rack 34 is powered downward by force producing means 22 via a gear action produced on rack gear means 36 by lever gear means 29 as lever gear arm 28 is powered upward. Generally a biasing means 40 (such as the coil spring shown) can be used to force pulldown piece 38 to its full forward position so that an engagement surface 39 of the fixture 12 engages with the pulldown piece 38 so that pulldown piece 38 will urge the fixture 12 into engagement with the probe field 18.

Figure 6:
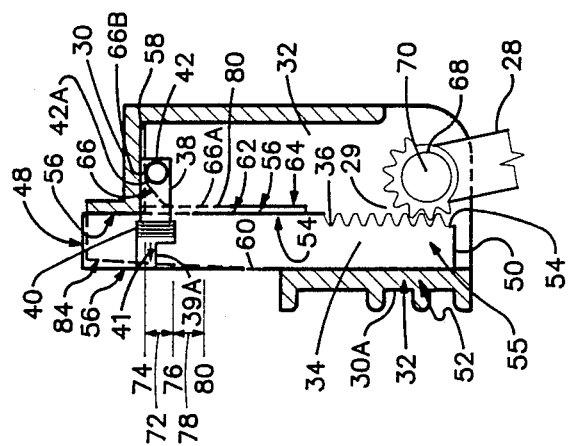
FIG. 6 is a detailed, partially cut away, side view of the fixture latching mechanism in its full up position.

FIG. 6 shows a detailed, partially cut way, side view of a preferred embodiment of fixture latching mechanism 30A in its full "up" position. Again, rack 34 is raised and lowered in a guide region 56 generally defined within the housing 32. Rack 34 preferably has a rectangular configuration having a top 48, a bottom 50, front face 52, rear face 54 and two opposing sides 55. The face 52 and rear 54 of the rack 34 are generally loosely confined respectively by the front side 60 and the rear side 62 of the guide region 56. The rear side 62 Of the guide region 56 is defined by a rear guidewall 64 located within the housing 32. The upper part of this guidewall 64 leads into a caming surface 66 which generally commences in lower region 66A and generally terminates in upper region 66B near the roof 58 of the housing 32. A cam follower 42 is shown with its front surface 42A urged against the upper region 66B of the caming surface 66. This urging action is produced by a biasing means 40 applied to the pulldown piece 38 in the forward direction 41 shown.

FIG. 6 also illustrates that gear means 36 is most preferably located in the lower portions of the rear face 54 of pulldown rack 34. The lever gear arm 28 is preferably held in place by a journal 68 opening in the housing 32 in which a shaft 70 is mounted in order to facilitate cooperation between the gear means 36 of the rack 34 and the gear means 29 of lever gear arm 28.

Figure 7:
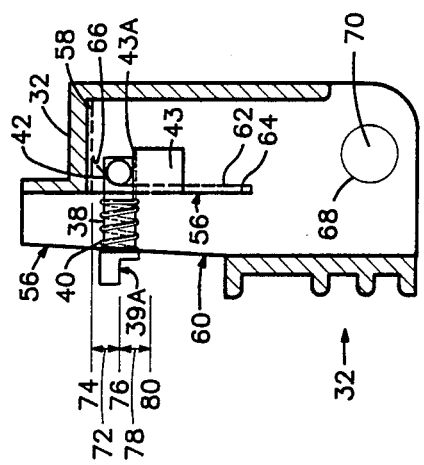
FIG. 7 is a detailed, partially cut away, side view of the fixture latching mechanism in a partial downward position.

FIG. 7 is a detailed, partially cutaway, side view of a preferred fixture latching mechanism in a partial downward position. Under the action of the biasing means 40, the cam follower 42 has reached the lower portion 66A of the cam surface 66 so that the caming action has ended and the pulldown pin 38 is now free of the caming action placed upon it and is urged to its full forward position by biasing means 40. FIG. 7 also illustrates a preferred embodiment of the fixture latching mechanism wherein the rack 34 is further provided with a support 43 upon which the pulldown piece 38 slidably rests for horizontal movement under the action of spring 40 and/or cam 66.

Figure 8:
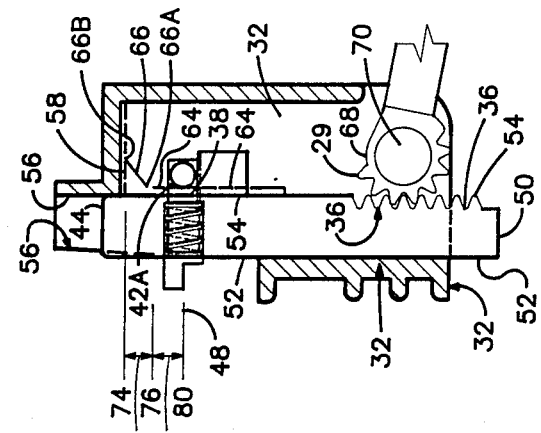
FIG. 8 is a detailed, partially cut-away, side view of the fixture latching mechanism in a full downward position.

FIG. 8 is a detailed, partially cut-away, side view of the fixture latching mechanism shown in its full downward position, wherein the fixture latching mechanism would be firmly pressing the fixture (not shown) down on the probe field (also not shown). Thus, the up and down movement of the pulldown piece 38 falls into two general movement regions. The first movement region 72 has an upper limit 74 which generally coincides with the upper region 66B of cam 66 and a lower limit 76 which generally coincides with the lower region 66A of cam 66. It is in this region 72 that the pulldown piece moves between its full forward position and its full rearward position under the caming action provided to the pulldown piece 38 via the cam follower 42. The second movement region 78 has an upper limit which generally coincides with the lower limit 76 of the upper region 72. The lower limit 80 of the second movement region 78 is achieved when lever gear arm 28 has, via the gear means 29 and 36, pulled the rack 34 to its lowest position. The cam follower 42 can also serve as a stop upon the forward movement of the pulldown 38 when the cam follower abuts on the rear surface 54 of the rack 34 under the action placed upon the pulldown 38 by spring 40.

Figure 9:
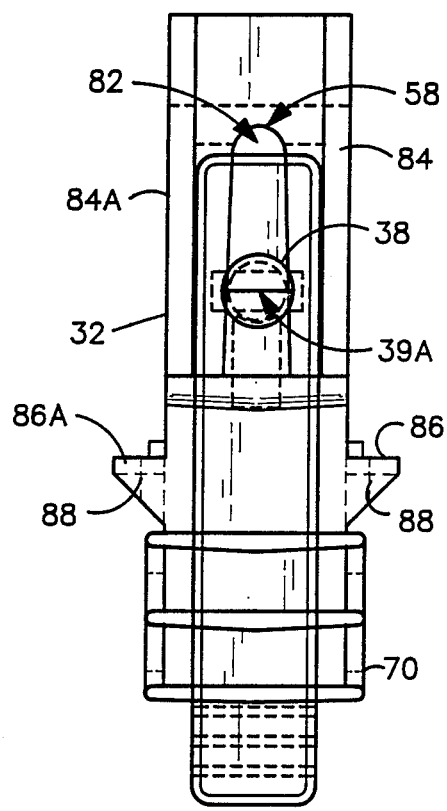
FIG. 9 is a front view of the pulldown tower.

FIG. 9 is a front view of the fixture latching mechanism. It shows the pulldown piece 38 in its full downward position wherein it projects through a slot 82 in the front face of the housing 32 which generally extends between sidewalls 84 and 84A of the housing 32. Means for holding the housing 32 to the fixture latching mechanism's frame (not shown) is generally indicated by a holder 86. For example each holder 86 may have a hole 88 through which a bolt (not shown) might be fastened. A shaft 70 upon which lever gear arm 28 (not shown) is pivotally mounted generally extends through the lower part of the housing 32. FIG. 9 also illustrates a preferred configuration for the pulldown piece 38. That is to say that this piece could have a rectangular, square, etc., cross-section, but a round cross-section, and hence a cylindrical configuration, is a highly preferred configuration for the pulldown. The front or nosepiece portion of the pulldown 38 is preferably cut into a half cylinder configuration so that it presents a flat surface 39 to the fixture 12 (not shown) as the fixture 12 is pulled down by pulldown piece 38.

Figure 10:
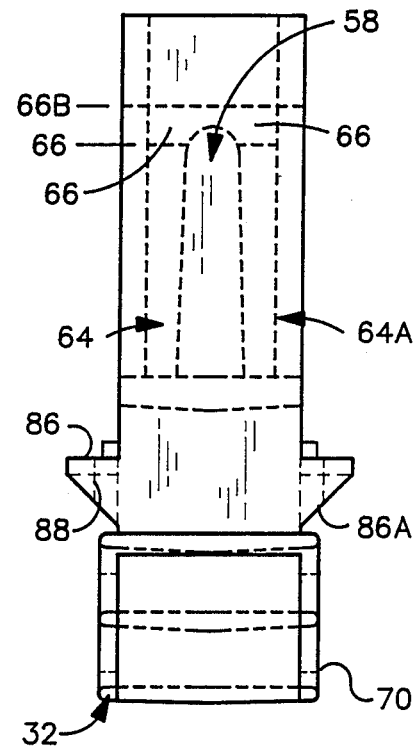
FIG. 10 is a rear view of the pulldown tower.

FIG. 10 is a rear view of the fixture latching mechanism. Shaft 70 is shown extending through the lower portion of the housing 32. The left side 64 and right side 64A of the rear guidewall are shown respectively leading up to caming surfaces 66 and 66A. FIG. 10 also illustrates that an inner ceiling region 58 of the housing 32 has a semicircular cross-section to accommodate the pulldown 38 having a cylindrical configuration.

Figure 11:
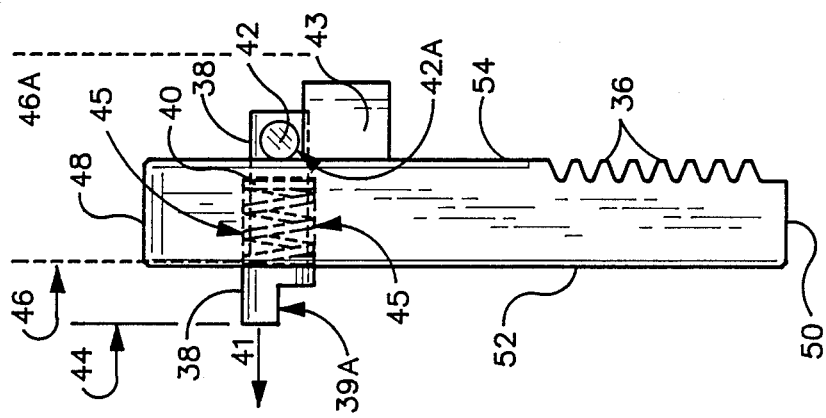
FIG. 11 is a detail of a rack showing the mechanism's pulldown piece in a full forward position.

FIG. 11 is a detail of the rack 34 wherein the pulldown 38 is shown in its full forward position 44. In this position the nosepiece of the pulldown piece 38 projects beyond the front face of the housing as shown in FIGS. 7 and 8. Preferably the pulldown 38 is housed in an opening or receiver 45 of the same cross-sectional configuration (e.g., square, rectangle, circle etc.) as the pulldown piece 38 and said receiver will extend through the rack 34 from and through its front face 52 to and through its rear face 54. In its more preferred embodiments a cylindrical pulldown piece 38 will be slidably mounted within a cylindrical receiver 45 and will be biased forward by a spring 40 (which is also housed in receiver 45) in a manner well known to the mechanical arts.

Figure 12:
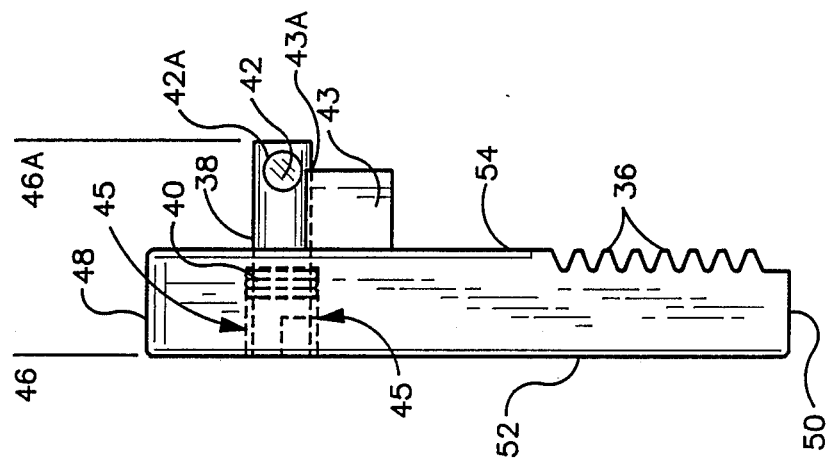
FIG. 12 is a detail of a rack showing the mechanisms pulldown piece in a full rearward position.

FIG. 12 shows the pulldown piece 38 in its full rearward position 47. In this full rearward position the pulldown piece 38 receives maximum support from pulldown support 43. Preferably pulldown piece 38 will slide in a trough 43A in the top surface of pulldown support 43.

FIG. 13 is a front view of rack 34. Preferably rack 34 will be provided with a pulldown piece 38 having a circular cross-section and a semicircular nosepiece which presents a flat surface 39 which engages a flat surface of an engagement ledge located in the side of the fixture 12 as shown in FIGS. 4 and 5. Most preferably cam follower 42 also has a cylindrical configuration and is mounted perpendicular to the long axis of pulldown piece 38 as shown.

FIG. 14 is a rear view of rack 34. It shows the rear end of the pulldown piece 38 slidably mounted in a trough 43A of support 43. FIG. 14 also shows that cam follower 42 is a cylinder which most preferably extends through the rear region of a cylindrical pulldown piece 38.

While the fixture latching mechanism and fixture latching mechanism systems of this patent disclosure have been set forth in the above specifications and drawings, it should be appreciated that in its broadest aspects, this invention is not so limited. Many other modifications, particularly in the configuration of various elements (e.g., the cross sectional configuration of the pulldown, rack) and the means by which certain mechanical functions (e.g., biasing means, gear means etc.) are carried out, can be changed in ways apparent to those skilled in this art so that these matters are also considered as being within the scope of this invention, as are many other equivalents which may be substituted therein.

Thus having disclosed this invention, what is claimed is:

1. A latching mechanism for bringing a fixture into and out of contact with at least one electrical test probe, said latching mechanism comprising:
   (1) a housing having an internal guidewall for guiding a pulldown rack and wherein said guidewall further comprises a caming surface;
   (2) a pulldown rack having gear means for receiving a mating gear means of a lever gear arm and receiver means for receiving a pulldown which is slidably mounted to said receiver means;
   (3) a lever gear arm having a mating gear means which engages the gear means of the rack and which is pivotally mounted in the housing; and
   (4) a pulldown having a nosepiece and a caming surface and which is: (a) slidably mounted to the receiver, (b) biased to a forward position in order to engage the nosepiece with a fixture as the pulldown rack moves in one direction and (c) pulled to a rearward position under a caming action imparted by the caming surface on the housing's internal guidewall to a cam follower attached to the pulldown as the rack moves in an opposite direction and thereby disengaging the nosepiece from the fixture.

2. The latching mechanism of claim 1 wherein the rack further comprises a pulldown support means upon which the pulldown slidably moves.

3. The latching mechanism of claim 1 wherein (a) the pulldown is slidably mounted for horizontal motion through a receiver located in an upper region of the rack, (b) the rack moves substantially vertically in response to a gearing action provided by the mating gear means of the lever arm and (c) a full rearward movement of the pulldown is achieved as the rack substantially reaches a full upward position.

4. The latching mechanism of claim 1 wherein the pulldown has a rear portion having a cylinder configuration and a nosepiece having a half cylinder configuration whose flat surface is on the underside of the nosepiece and which engages the fixture as the pulldown is forced in a downward direction by the rack as it is forced downward by the lever gear arm.

5. The latching mechanism of claim 1 wherein the pulldown is biased to a full forward position by a spring mounted in the rack's receiver means and wherein the full forward position is defined by an abutting action of the cam means on the rack.

6. The latching mechanism of claim 1 wherein the caming surface is on a forwardly biased caming cylinder mounted in, and normal to a rear portion of a cylindrical pulldown such that the guidewall and its caming surface are interjected between the rack and the forwardly biased caming cylinder as the rack is guided up and down in the housing.

7. A latching mechanism system for bringing a circuit board test fixture into and out of contact with a probe field wherein said latching mechanism system comprises at least two pulldown towers each of which pulldown towers individually comprises:
   (1) a housing having a first slot and a rectangular guidewall system whose rear wall has a rear wall slot for guiding a pulldown rack in response to a gear action imparted to said pulldown rack, and wherein said guidewall further comprises a caming surface;
   (2) a rectangular pulldown rack having gear means for receiving a mating gear means of a lever gear arm and receiver means for receiving a pulldown which is slidably mounted in said receiver means;
   (3) a lever gear arm having a mating gear means which engages the gear means of the rack and which is pivotally mounted to the housing; and
   (4) a pulldown having a nosepiece and a caming surface and which is (a) slidably mounted in the receiver, (b) biased to a forward position in order to engage the nosepiece with a fixture as the pulldown rack moves in one direction and (c) pulled to a rearward position under a caming action imparted to the pulldown by the caming surface on the housing guidewall as the rack moves in an opposite direction in order to disengage the nosepiece from the fixture.

8. The latching mechanism of claim 7 wherein the rack further comprises a pulldown support means.

9. The latching mechanism of claim 7 wherein: (a) the pulldown is slidably mounted for horizontal motion through a hollow cylindrical receiver located in an upper region of the rack, (b) the rack moves substantially vertically in response to a gearing action provided by the mating gear means of the lever gear arm and (c) a full rearward movement of the pulldown is achieved as the rack reaches a full upward position.

10. The latching mechanism of claim 7 wherein the pulldown has a rear portion having a cylindrical configuration and a nosepiece having a half cylinder nosepiece whose lower flat portion engages the fixture.

11. The latching mechanism of claim 7 wherein the pulldown is biased to a full forward position by a spring mounted in the rack's receiver means and wherein the full forward position is defined by an abutting action of the cam means on the rack.

12. The latching mechanism of claim 7 wherein the caming surface is on a forwardly biased caming cylinder mounted in, and normal to a rear portion of a cylindrical pulldown such that the guidewall and its caming surface are interjected between the rack and a forwardly biased caming cylinder as the rack is guided up and down in the housing.

13. A latching mechanism system for bringing a circuit board text fixture into and out of contact with a probe field wherein said latching mechanism system comprises at least two, but no more than four pulldown towers each of which pulldown towers individually comprises:
   (1) a housing having (a) a slotted front face, (b) an open bottom region for receiving a gear arm lever and allowing passage of a rack, (c) a journal opening in each side for mounting a shaft upon which the gear arm lever is mounted, (d) an open top for allowing passage of the rack and (e) means for attaching the pulldown tower to a base and (f) an internal, rectangular guidewall system whose rear wall has a rear wall slot which divides said rear wall into a first rear wall section and a second rear wall section, and wherein the guidewall system guides a pulldown rack having a front surface, a rear surface and two side surfaces in response to a gear action imparted to gear teeth located in a lower region of the rear surface of said rack, and wherein said first rear wall section and second rear wall section each have a caming surface in the upper region of each of said rear wall sections further comprising a caming surface;

(2) a rectangular pulldown rack having gear means for receiving a mating gear means of a lever gear arm and a hollow, horizontally mounted receiver means for receiving a cylindrical pulldown which is slidably mounted in said receiver means;

(3) a lever gear arm having a mating gear which engages the gear means of the rack and which is pivotally mounted to the housing; and (4) a pulldown having a nosepiece and a caming surface and which (a) is slidably mounted in the receiver, (b) is biased to a forward position by a spring housed in the receiver in order to engage the nosepiece with a fixture as the pulldown rack moves in a downward direction, (c) reaches a full forward position substantially before the rack reaches a full downward position and (d) is pulled to a rearward position under a caming action imparted to the pulldown by the caming surface on the housing guidewall as the rack moves in an upward direction in order to disengage the nosepiece from the fixture.

14. The latching mechanism of claim 13 wherein the rack further comprises a pulldown support means having a curved trough in which the lower portion of a cylindrical pulldown rides.

15. The latching mechanism of claim 13 wherein the pulldown has a rear portion having a cylindrical configuration and a nosepiece having a half cylinder nosepiece whose lower flat portion engages a slotted opening in the side of the fixture.

16. The latching mechanism of claim 13 wherein the pulldown is biased to a full forward position by a coil spring mounted in the rack's receiver means and wherein the full forward position is defined by an abutting action of a cylindrical cam means as said cam means is biased forward into the rear surface of the rack by the forward action of the coil spring on the pulldown.

17. The latching mechanism of claim 13 wherein the caming surface is on a forwardly biased caming cylinder mounted in, and normal to a rear portion of a cylindrical pulldown such that the guidewall and its caming surface are interjected between the rack and a forwardly biased caming cylinder as the rack is guided up and down in the housing.

* * * * *